United States Patent
Ma et al.

[11] Patent Number: 5,981,403
[45] Date of Patent: Nov. 9, 1999

[54] LAYERED SILICON NITRIDE DEPOSITION PROCESS

[75] Inventors: Yi Ma; Sailesh Mansinh Merchant; Pradip Kumar Roy, all of Orlando, Fla.

[73] Assignee: Lucent Technologies, Inc., Murray Hill, N.J.

[21] Appl. No.: 08/977,319

[22] Filed: Nov. 24, 1997

[51] Int. Cl.[6] .......................... H01L 21/31; H01L 21/469
[52] U.S. Cl. .......................... 438/758; 438/761; 438/778; 438/787; 438/791
[58] Field of Search ................................. 438/761, 791, 438/758, 778, 787

[56] References Cited

U.S. PATENT DOCUMENTS

| | | |
|---|---|---|
| 4,742,020 | 5/1988 | Roy ............................................ 437/61 |
| 5,032,545 | 7/1991 | Doan et al. . |
| 5,132,244 | 7/1992 | Roy ............................................ 437/13 |
| 5,153,701 | 10/1992 | Roy ............................................ 357/54 |
| 5,756,404 | 5/1998 | Friedenreich et al. . |

*Primary Examiner*—John F. Niebling
*Assistant Examiner*—Josetta I. Jones

[57] ABSTRACT

A semiconductor device process for forming a multilayered nitride structure. The nitride is used as either isolation or as part of a dielectric structure. The deposition rate for the nitride is varied to form a multilayered structure with stress accommodation at the interface between sub-layers in the multilayer structure. In addition, the sub-layered structure reduces pin-holes and microcracks in the nitride film and improves the overall uniformity in thickness of the final nitride film.

7 Claims, 2 Drawing Sheets

LAYERED SILICON NITRIDE DEPOSITION PROCESS

BACKGROUND OF THE INVENTION

1. Field of the Invention

The present invention relates to a technique for making a semiconductor device that includes the formation of a reduced-stress nitride layer on the semiconductor device

2. Description of the Prior Art

In conventional semiconductor device processing, nitride layers are utilized in isolation structures and as part of an inter-level dielectric structure ("ONO" or "ONON" dielectrics, for example that use alternating layers of oxide and nitride). Presently, an LPCVD process is used to deposit the nitride in a single step on the oxide surface. In particular, $NH_3$ and $SiH_2Cl_2$ are reacted at temperatures between 750° C. and 850° C. to form the nitride film. This process results in generating significant stress between the deposited nitride and underlying oxide, forming defects in the structure and a large variability in the nitride thickness. These problems limit the usefulness of the nitride film in sub-micron applications where thickness needs to be well-controlled. The stress also results in the formation of microcracks and pin-holes in the structure and is problematic when used as part of an ONO or ONON dielectric.

SUMMARY OF THE INVENTION

We have invented an improved technique for depositing nitride layers in semiconductor device processing that addresses the concerns described above. In particular, a multilayered nitride deposition process has been developed where the deposition rate is controlled (low-high-low-high...) to create a multilayer structure that includes stress accommodation at the interface between layers. The internal stress relief results in an overall nitride layer of improved uniformity in thickness with a significant reduction in micro-cracks and other stress-related characteristics.

DETAILED DESCRIPTION

Figure 1:
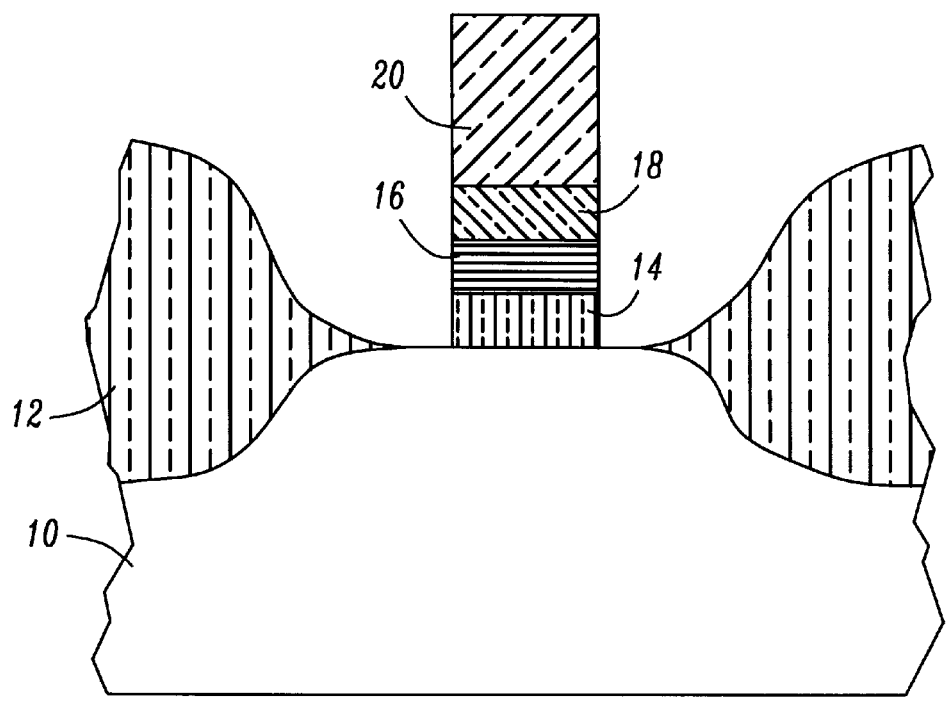
FIG. 1 shows a cross-section of an exemplary gate oxide structure including an "oxide-nitride-oxide" (ONO) dielectric region utilizing a multilayered nitride structure.
Figure 2:
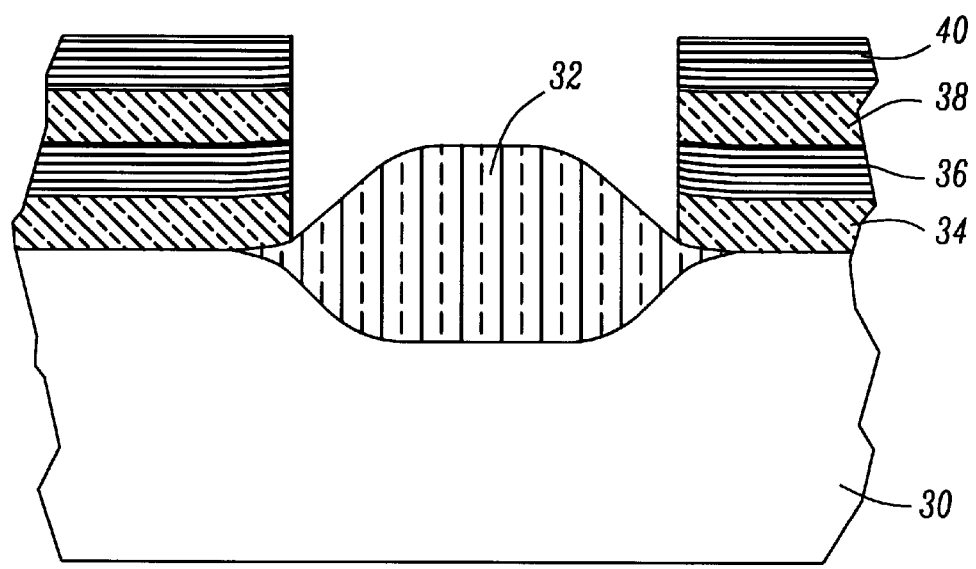
FIG. 2 is a cross-section of an exemplary LOCOS isolation region including an "oxide-nitride-oxide-nitride" (ONON) dielectric region utilizing a multilayered nitride structure.
Figure 3:
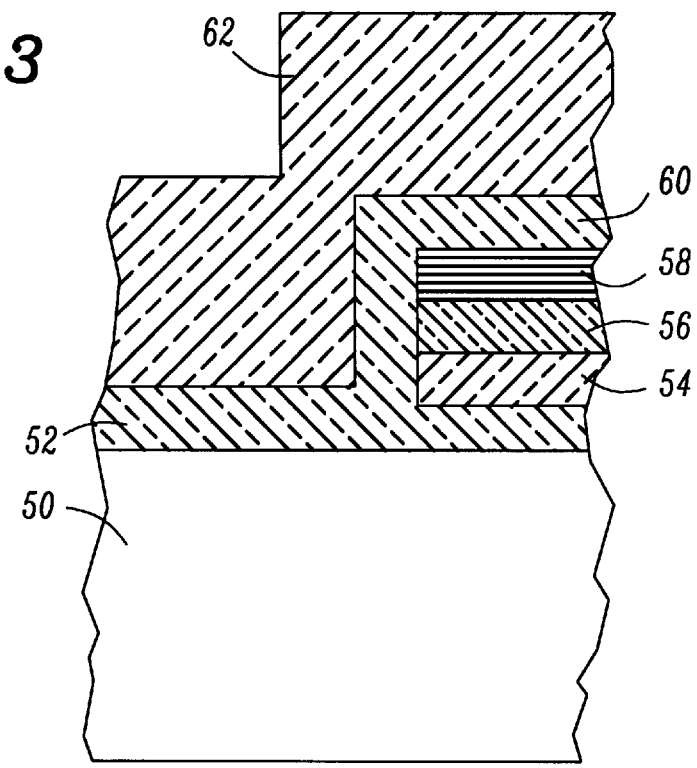
FIG. 3 illustrates a cross-section of an exemplary flash $E^2PROM$ using an ONO isolation region formed in accordance with the present invention.

The present detailed description relates to an improved method of forming a semiconductor device comprising a layered nitride structure. There are many applications where nitride layers use used in isolation structures and as part of an inter-level dielectric. FIG. 1 illustrates an exemplary gate oxide structure that utilizes a nitride layer within the oxide. As shown, a silicon substrate 10 includes a field oxide region 12 and a gate oxide structure formed within an opening in field oxide 12. In the embodiment illustrated in FIG. 1, the gate oxide structure includes a first layer 14 of oxide, a nitride layer 16 and a second oxide layer 18. A polysilicon layer 20 forms the upper surface of the gate structure. As will be described in detail below, the gate structure formed in accordance with the present invention is of improved quality over the prior art, since nitride layer 16 is formed as a multilayer structure. The multilayer structure inherently includes stress accommodation at the interface between each layer of the multilayer structure. The internal stress relief thus results in an overall improved uniformity of the composite nitride layer. A LOCOS isolation application for utilizing a multilayered nitride layer is shown in FIG. 2. As shown, a silicon substrate 30 includes an isolation region 32, with an ONON structure formed to surround isolation region 32. In particular, the ONON structure includes a first oxide layer 34, a first nitride multilayer region 36, a second oxide layer 38 and a second nitride multilayer region 40. The utilization of the multilayer structure, as stated above, has been found to improve the uniformity of the overall nitride layer thickness. FIG. 3 illustrates an exemplary $E^2PROM$ application that utilizes an interlevel dielectric including a multilayered nitride region formed in accordance with the present invention. As shown, an oxide layer 56 and multi-layered nitride region 58 are disposed between a transfer gate oxide 50 and a gate polysilicon region 54. Again, the use of the multilayering process yields a final nitride layer with improved uniformity of thickness, as well as reduced pinholes and microcracks.

Figure 4:
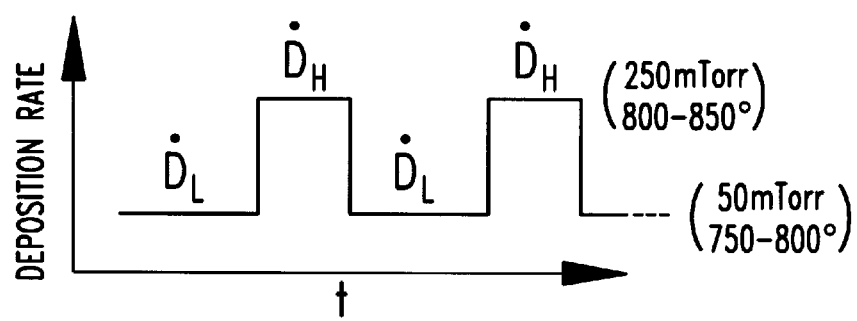
FIG. 4 shows an exemplary periodic change in nitride deposition rate as a function of time.
Figure 5:
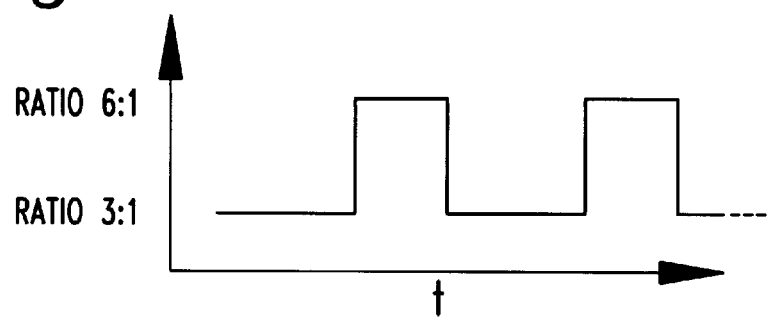
FIG. 5 illustrates an optional change in reactant concentration during the deposition process.

FIGS. 4 and 5 are useful in understanding the multilayering process of the present invention. Referring to FIG. 4, the rate of depositing the nitride layer is varied as a function of time. In the illustrative case, two period cycles are shown, producing four sub-layers of deposited nitride. However, the number of cycles, and hence the number of sub-layers, may be any desired number. The deposition sequence typically begins with a lower deposition rate ($D_L$), followed by a high deposition rate ($D_H$), which comprises the first cycle. The lower rate may be, for example, between 10 Å/min and 15 Å/min and the higher rate may be any where between 30Å/min and 50 Å/min. The sequence continues with additional cycles. The duration of each portion is controlled so that approximately the same thickness layer is deposited during each half-cycle. For example, if the higher deposition rate is three times that of the lower rate (e.g., 30 Å/min vs. 10 Å/min), the deposition at the lower rate will be carried out for a length of time that is triple the length of the high deposition rate half-cycle. The deposition rate differences are typically produced by changing either the pressure or the gas flow rates, or both, during the deposition process. Other factors, including the temperature, may also be used to change the deposition rate if desired. For example, the lower rate deposition process may be carried out a temperature between 750° C. and 800° C.; the higher rate process may be performed at a temperature within the range of 800° C. and 850° C. The result of these changes during deposition is sub-layering of the deposited nitride, also referred to as "multi-layering". The interfaces between the sub-layers provides for stress accommodation within the structure. Other benefits will result, including the reduction of microcrack formation within the nitride structure.

In addition to providing cyclical changes in the deposition rate, the present invention provides for modifying the silicon content in alternate sub-layers by varying the ratio of $NH_3$:$SiH_2Cl_2$ between 3:1 (or lower) for the low deposition rate and 6:1 (or higher) for the high deposition rate. FIG. 5 illustrates this variation in silicon content.

The above process will be more fully illustrates by means of the following Example.

EXAMPLE

A multilayered silicon nitride film was deposited on an oxide layer. The first nitride sub-layer was deposited at a rate $D_L$ of 10 Å/min using an $NH_3:SiH_2Cl_2$ ratio of 3:1 at a reactor pressure of 50 mTorr and reactor temperature of 750° C. The next sublayer was deposited at a rate $D_H$ of 30 Å/min using an $NH_3:SiH_2Cl_2$ ratio of 6:1 at a reactor pressure of 250 mTorr and reactor temperature of 800° C. This sequence is then repeated until the desired nitride thickness is obtained. In general, at least three layers are required to provide the desired stress accommodation results. The nitride thickness variability in the above-described multilayer structure was found to be <2%. The reduction in stress was also found to reduce pin-holes and microcracks in the nitride film.

We claim:

1. A method of making a semiconductor device comprising the steps of:
   a) forming an oxide layer; and
   b) forming a nitride layer to overlay the oxide layer, wherein the step of forming the nitride layer includes the steps of:
      1) depositing a first nitride sub-layer at a first deposition rate; and
      2) depositing a second nitride sub-layer at a second deposition rate that is different from said first rate; and
      3) repeating steps 1) and 2) a predetermined number of times until a desired nitride deposited thickness is achieved.

2. The method as defined in claim 1 wherein in performing steps b1) and b2) the first deposition rate is lower than the second deposition rate.

3. The method as defined in claim 2 wherein in performing step b1), the deposition occurs at a temperature in the range of approximately 750–800° and in performing step b2), the deposition occurs at a temperature in the range of approximately 800–850°.

4. The method as defined in claim 2 wherein in performing step b1), the deposition occurs at a pressure of approximately 50mTorr and in performing step b2), the deposition occurs at a pressure of approximately 250 mTorr.

5. The method as defined in claim 2 wherein the first deposition rate is between 10 Å/min and 15 Å/min and the second deposition rate is between 30 Å/min and 50 Å/min.

6. The method as defined in claim 1 wherein in performing steps b1) and b2), the silicon content of the deposited nitride is varied.

7. The method as defined in claim 6 wherein in performing step b1) the ratio of $NH_3:SiH_2Cl_2$ is 3:1 or lower and in performing step b2) the ratio of $NH_3:SiH_2Cl_2$ is 6:1 or higher.

* * * * *